(12) United States Patent
Yoshida

(10) Patent No.: US 9,614,106 B2
(45) Date of Patent: Apr. 4, 2017

(54) SEMICONDUCTOR DEVICE

(71) Applicant: FUJI ELECTRIC CO., LTD., Kawasaki-shi, Kanagawa (JP)

(72) Inventor: Souichi Yoshida, Kawasaki (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/960,274

(22) Filed: Dec. 4, 2015

(65) Prior Publication Data
US 2016/0211257 A1 Jul. 21, 2016

(30) Foreign Application Priority Data

Jan. 15, 2015 (JP) .................................. 2015-005625

(51) Int. Cl.
| | | |
|---|---|---|
| *H01L 29/66* | (2006.01) | |
| *H01L 29/861* | (2006.01) | |
| *H01L 29/739* | (2006.01) | |
| *H01L 29/423* | (2006.01) | |
| *H01L 27/07* | (2006.01) | |
| *H01L 29/08* | (2006.01) | |
| H01L 29/06 | (2006.01) | |
| H01L 29/10 | (2006.01) | |
| H01L 29/36 | (2006.01) | |

(52) U.S. Cl.
CPC ........ *H01L 29/861* (2013.01); *H01L 27/0727* (2013.01); *H01L 29/0834* (2013.01); *H01L 29/42368* (2013.01); *H01L 29/7397* (2013.01); *H01L 29/0696* (2013.01); *H01L 29/1095* (2013.01); *H01L 29/36* (2013.01); *H01L 29/66348* (2013.01)

(58) Field of Classification Search
CPC ............. H01L 27/0644; H01L 29/7397; H01L 29/0696; H01L 29/861; H01L 29/42368; H01L 27/0727; H01L 29/0834; H01L 29/1095; H01L 29/36
USPC ........ 257/140, 139, 168, 331, 329, E21.382, 257/E29.027; 438/140, 141, 270, 271
See application file for complete search history.

(56) References Cited

U.S. PATENT DOCUMENTS

2005/0045960 A1 3/2005 Takahashi
2009/0001411 A1* 1/2009 Tokura ................ H01L 27/0664
257/140

FOREIGN PATENT DOCUMENTS

| JP | 2005-101514 A | 4/2005 |
|---|---|---|
| JP | 2008-192737 A | 8/2008 |
| JP | 2010-251608 A | 11/2010 |

(Continued)

*Primary Examiner* — Thinh T Nguyen
(74) *Attorney, Agent, or Firm* — Rabin & Berdo, P.C.

(57) ABSTRACT

In an IGBT portion, a first gate electrode is provided in a first trench via a first gate insulating film. A thickness of a first gate insulating film lower portion is thicker than a thickness of a first gate insulating film upper portion, whereby a width of a mesa portion between adjacent first trenches is narrower at a portion of a collector side than at an emitter side. In a diode portion, a second gate electrode is provided inside a second trench via second gate insulating film. A width of the second trench is uniform along a depth direction or narrows from the emitter side toward the collector side. Widths of the second trench are narrower than a sum of a width of the first trench lower portion and the thickness of the first gate insulating film lower portion of both side walls of the first trench lower portion.

7 Claims, 15 Drawing Sheets

(56) References Cited

FOREIGN PATENT DOCUMENTS

| JP | 2012-043890 A | 3/2012 |
|----|---------------|--------|
| JP | 2013-149909 A | 8/2013 |

\* cited by examiner

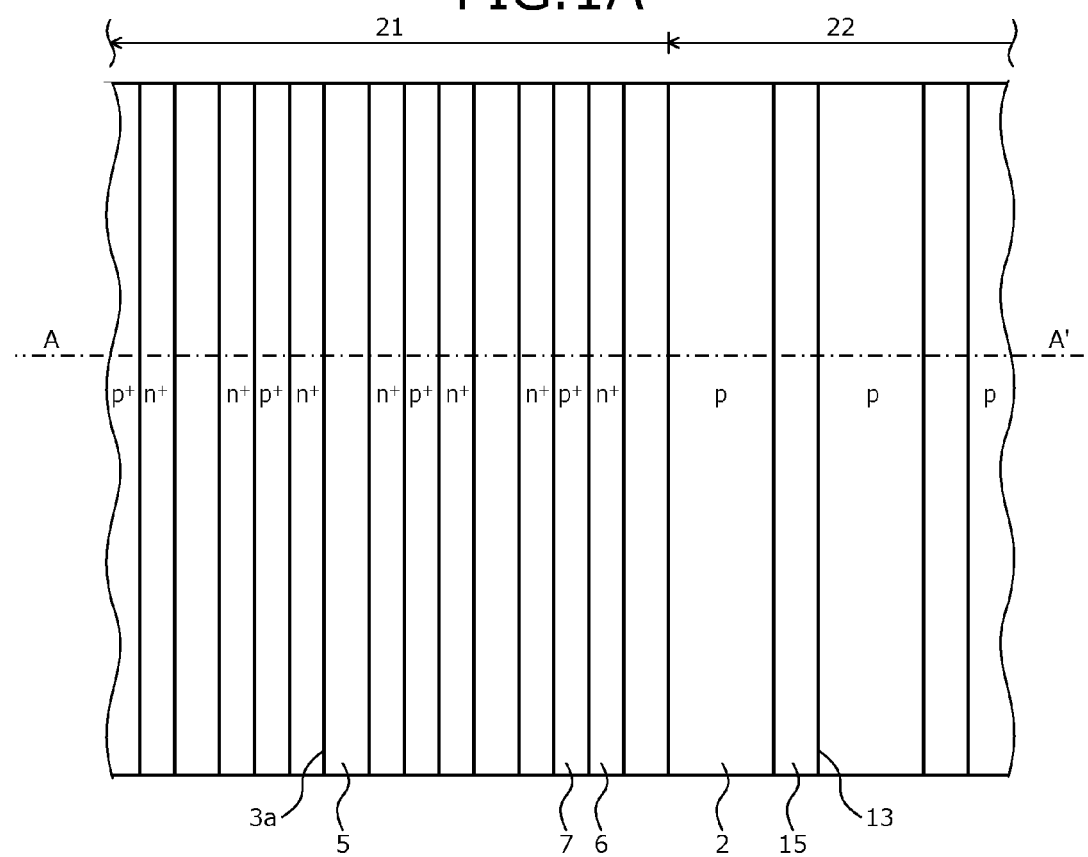

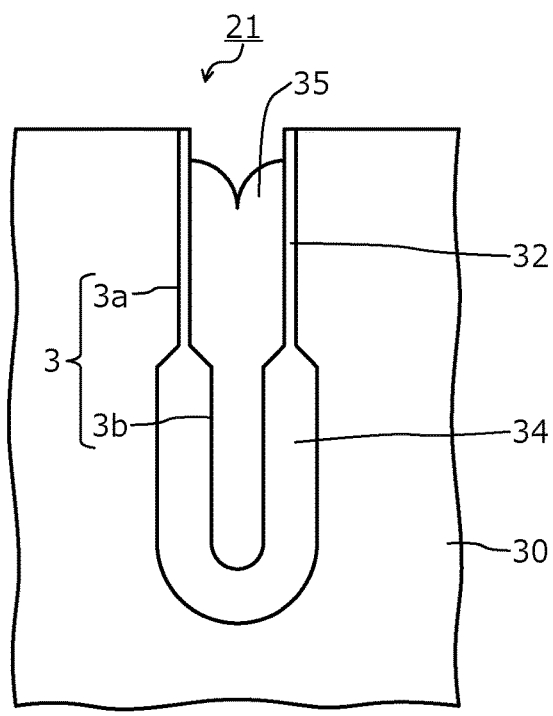
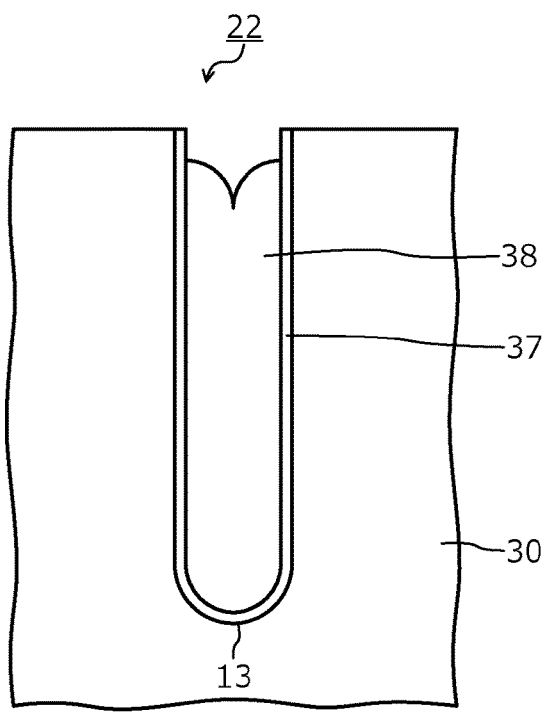
FIG.13A
FIG.13B

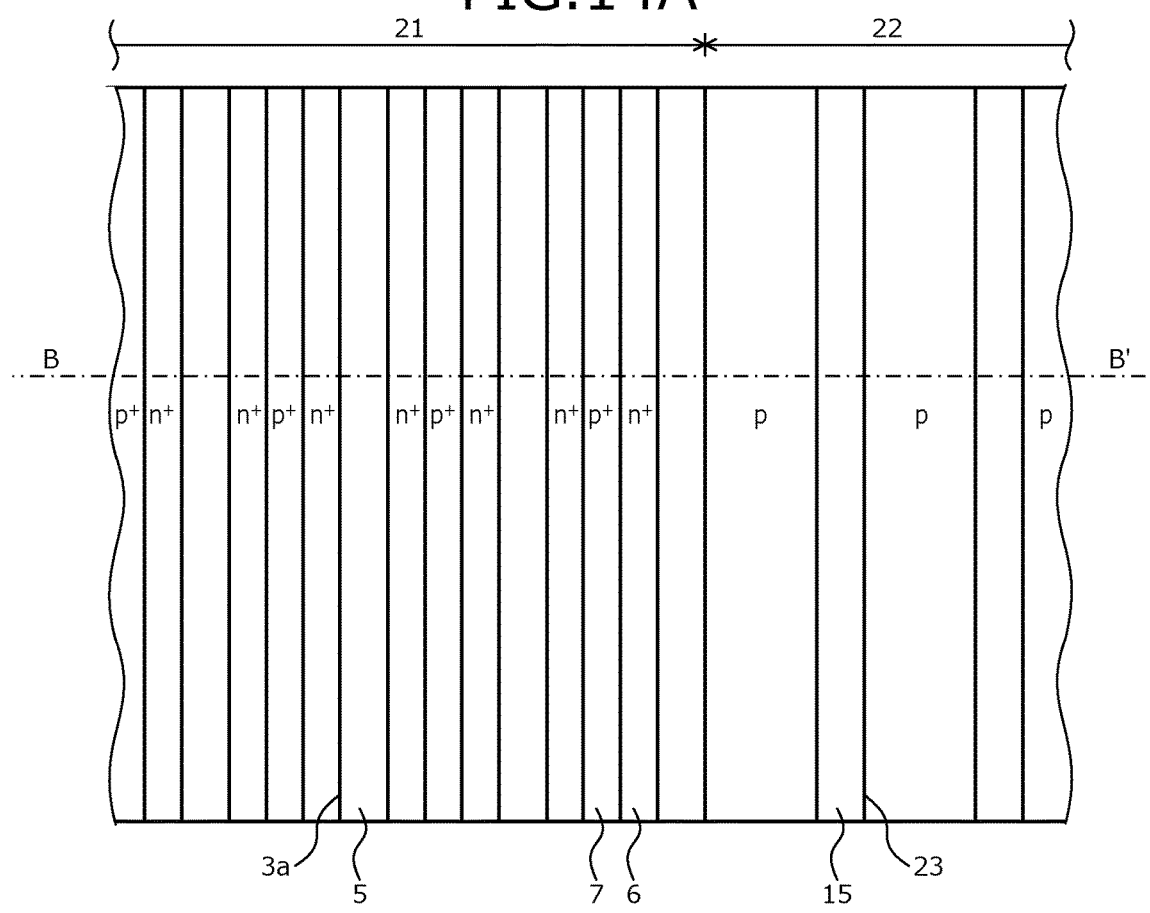

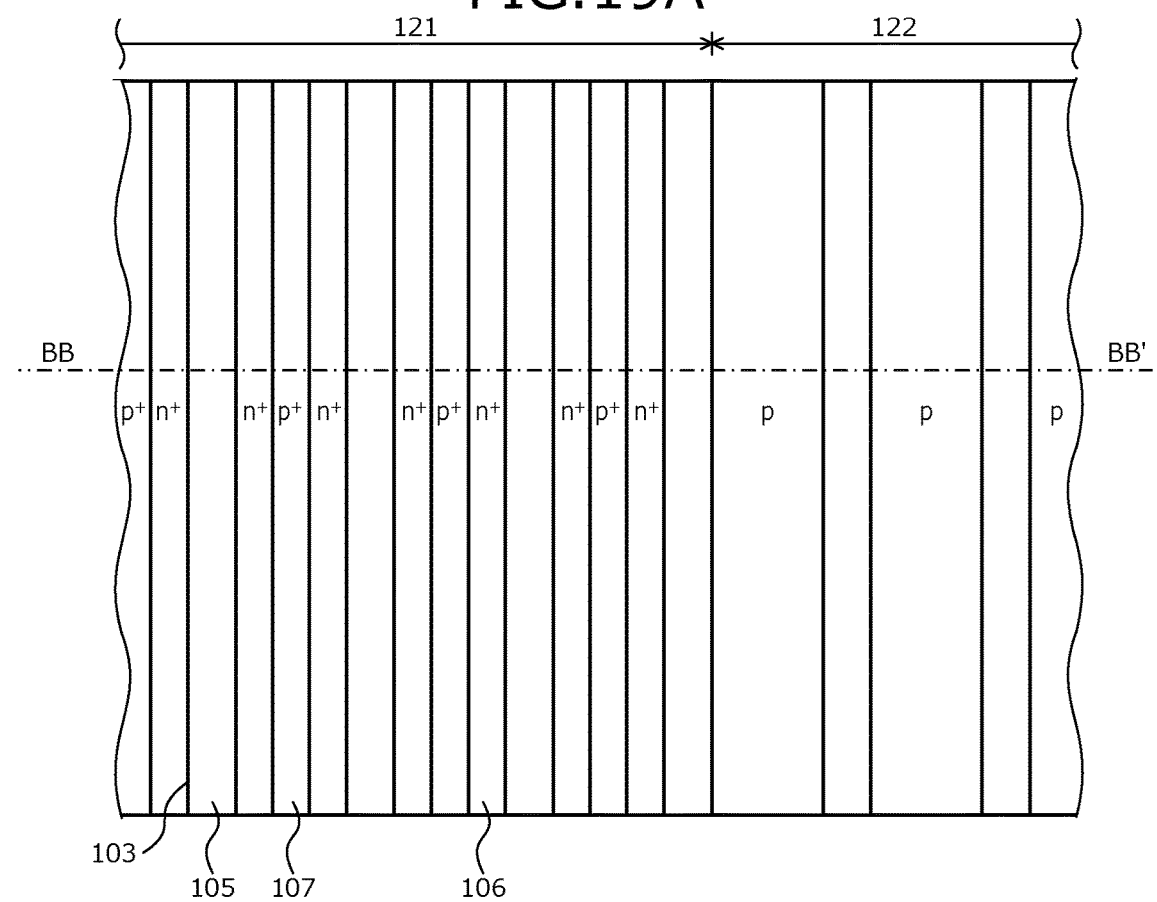

SEMICONDUCTOR DEVICE

BACKGROUND OF THE INVENTION

1. Field of the Invention

The embodiments discussed herein are related to a semiconductor device.

2. Description of the Related Art

Improvement of the properties of 600V, 1200V, and 1700V rated power semiconductor devices such as insulated gate bipolar transistors (IGBT) and free wheeling diodes (FWD), hereinafter "diode", is advancing. Such power semiconductor devices are used in power converting equipment such as highly efficient, power-saving inverters and are essential in motor control of power conversion equipment. Further, concerning power semiconductor devices for such power control applications, there is immediate market demand for properties of low loss (power-saving), high-speed, high efficiency, and environmental friendliness.

In response to such demands, for example, the following fabrication method has been proposed for IGBTs. First, with consideration of wafer crack prevention in the wafer process, the wafer process is started with a thick semiconductor wafer that is generally used. As far as possible, in the latter half of the wafer process, the semiconductor wafer is ground as thin as possible within an allowable range to obtain a given property, the semiconductor wafer is ground from a back side that is the opposite side of the semiconductor wafer with respect to the surface (front surface), which is the metal-oxide semiconductor gate (MOS gate) portion side of the semiconductor wafer. An activation process is performed of injecting an impurity by ion injection from the back surface after grinding of the semiconductor wafer, the impurity being of an impurity concentration sufficiently tested in terms of design, whereby a semiconductor device that has low electrical loss such as low turn-on voltage is completed at a low cost.

Recently, the development and structure of a low loss semiconductor device achieved at a low cost by the method of reducing the thickness of the semiconductor substrate (semiconductor wafer) as described above, has become mainstream particularly for power semiconductor devices. Further, consequent to introducing an impurity from the back surface after grinding of the semiconductor wafer as described above, for low loss IGBTs, a process step has to be performed of forming at a position on the substrate back surface side and deeper than a $p^+$-type collector region, an n-type field stop (FS) layer of a higher impurity concentration than the $n^-$-type drift layer. The n-type FS layer has a function of suppressing a depletion layer from reaching the $p^+$-type collector region, the depletion layer extends from a pn junction between a $n^-$-type drift layer and a p-type base region in an off state.

Further, to reduce the size of a related chip that includes an IGBT, development of a reverse conducting (RC) IGBT equipped with a vertical IGBT of a trench gate structure and a diode connected antiparallel to the vertical IGBT integrated on the same semiconductor substrate is advancing. A collector-shorted type device having only a trench structure portion (MOS gate portion) disposed on the substrate front surface side by a plane pattern similar to a typical IGBT, and having disposed in parallel on the substrate back surface side, an $n^+$-type cathode region forming a diode portion and a $p^+$-type collector region forming an IGBT portion has been proposed as an RC-IGBT (for example, refer to Japanese Patent Application Laid-Open Publication No. 2005-101514).

As another RC-IGBT, a device has been proposed that has a diode dedicated region in a diode portion (diode operating region) without disposing a trench structure portion of an $n^+$-type emitter region, trench, gate insulating film, or gate electrode (for example, refer to Japanese Patent Application Laid-Open Publication No. 2008-192737). In the diode portion, for example, a p-intrinsic-n (PiN) diode, a Merged PiN Schottky (MPS) diode, etc. are disposed.

Further, a device in which a trench of the same shape as the IGBT portion is disposed in the diode portion has been proposed as another RC-IGBT (for example, refer to Japanese Patent Application Laid-Open Publication Nos. 2012-043890 and 2013-149909). Japanese Patent Application Laid-Open Publication Nos. 2012-043890 and 2013-149909 describe that in the diode portion, without disposal of an $n^+$-type emitter region in p-type base region, and inside a trench through gate insulating film, a gate electrode of the emitter potential or the gate potential is embedded. Further, in Japanese Patent Application Laid-Open Publication No. 2013-149909, the trench pitch in the IGBT portion and in the diode portion differs.

As a structure that improves IGBT properties, a structure has been proposed for which the injection enhanced (IE) effect has been increased by making a portion of a gate insulating film formed along the trench inner wall and abutting the $n^-$-type drift layer thicker than a portion abutting the p-type base region, whereby the width (distance between trenches (hereinafter, mesa width)) of the portion of the p-type base region between adjacent trenches (hereinafter, mesa portion) is reduced (for example, refer to Japanese Patent Application Laid-Open Publication No. 2010-251608). In Japanese Patent Application Laid-Open Publication No. 2010-251608, the trench width (width along the direction in which trenches are aligned) on the collector side is made wider than the emitter side, whereby the carrier concentration of the $n^-$-type drift layer is increased and the ON voltage is lowered.

A conventional IGBT structure that reduces the width (mesa width) of the mesa portion between trenches as indicated in Japanese Patent Application Laid-Open Publication No. 2010-251608 will be described with reference to FIGS. 18A and 18B. FIGS. 18A and 18B are schematic views of a conventional IGBT gate structure. FIG. 18A depicts a planar structure of the substrate front surface side and FIG. 18B depicts a cross sectional structure along cutting plane line AA-AA' of FIG. 18A. In FIGS. 18A and 18B, depiction of interlayer insulation films, emitter electrodes, and passivation films is omitted (similarly for FIGS. 19A and 19B). Further, in FIG. 18A, depiction of the gate insulating film is omitted (similarly for FIG. 19A). As depicted in FIGS. 18A and 18B, in a conventional IGBT, a p-type base region 102 is disposed in a superficial layer of a front surface of an $n^-$ type semiconductor substrate (semiconductor chip) forming an $n^-$-type drift layer 101.

Trenches 103 are disposed from a front surface of the $n^-$-type drift layer 101, through the p-type base region 102, reaching the $n^-$-type drift layer 101. The trenches 103 are disposed in a striped-shape planar layout, separating the p-type base region 102 into plural regions (mesa portions). A gate electrode 105 is disposed inside the trench 103, via a gate insulating film 104. The width of the trench 103 is wider on the collector side than on the emitter side. The thickness of the gate insulating film 104 is thicker at a portion 104b of the collector side between the $n^-$-type drift layer 101 and the gate electrode 105 than a portion 104a of the emitter side between an $n^+$-type emitter region 106 described hereinafter and the gate electrode 105.

Inside the p-type base region 102, the n+-type emitter region 106 and a p+-type contact region 107 are selectively provided in each mesa portion. The n+-type emitter region 106 and the p+-type contact region 107 are disposed in a linear-shaped planar layout parallel to the trenches 103. An emitter electrode (not depicted) contacts the n+-type emitter region 106 and the p+-type contact region 107, and is electrically insulated from the gate electrode 105 by an interlayer insulation film (not depicted). In the superficial layer of the back surface of the n type semiconductor substrate, an n-type FS layer 109 is provided, and a p+-type collector region 111 is provided at a position that is shallower than the n-type FS layer 109. Reference numerals 108 and 110 respectively represent the emitter electrode and a collector region 110.

In such a conventional FS-IGBT, by simply combining a conventional diode, an RC-IGBT can be configured. FIGS. 19A and 19B are schematic views of a conventional RC-IGBT gate structure. FIG. 19A depicts a planar structure of the substrate front surface side and FIG. 19B depicts a cross sectional structure along cutting plane line BB-BB' of FIG. 19A. As depicted in FIGS. 19A and 19B, on a single semiconductor substrate (semiconductor chip), an IGBT portion 121 forming an IGBT operating region and a diode portion 122 forming a diode operating region are provided. The structure of the IGBT in the IGBT portion 121 is similar to the FS-IGBT depicted in FIGS. 18A and 18B. In the diode portion 122, similar to the IGBT portion 121, the p-type base region 102, the trench 103, the gate insulating film 104, and the gate electrode 105 are provided in the substrate front surface side.

Further, in the diode portion 122, the p-type base region 102 functions as a p-type anode region and the n+-type emitter region 106 is not provided. The emitter electrode 108, in the diode portion 122, contacts the p-type base region 102 and functions as an anode electrode. The substrate back surface side is structured such that a portion of a p+-type collector region 111 is replaced by an n+-type cathode region 112. The p+-type collector region 111 opposes a MOS gate structure of the IGBT, across the n−-type drift layer 101. The n+-type cathode region 112 opposes a p-type anode region of the diode, across the n−-type drift layer 101. The collector region 110 contacts the p+-type collector region 111 and the n+-type cathode region 112, and functions as a cathode electrode. By configuring the diode portion 122 in this manner, the diode is connected antiparallel to the IGBT of the IGBT portion 121.

Nonetheless, in an RC-IGBT configured by simply combining a conventional IGBT and a conventional diode on a single semiconductor substrate as in Japanese Patent Application Laid-Open Publication Nos. 2005-101514, 2012-043890, and 2013-149909, when the mesa width is reduced and the IE effect of the IGBT is raised, diode properties deteriorate. More specifically, when the trench 103 having the width of the collector side wider than that of the emitter side is also disposed in the diode portion 122 and the mesa width is reduced as in Japanese Patent Application Laid-Open Publication No. 2010-251608 (refer to FIGS. 19A and 19B), although reduction of the size of the semiconductor chip is possible, the adverse effect of minority carrier removal being hindered becomes prominent during reverse recovery operation of the diode. Consequently, since minority carrier discharge takes time during reverse recovery operation of the diode, a problem arises in that reverse recovery current and reverse recovery loss become large. Such problems can be avoided by not providing the trench structure portion in the diode portion (diode operating region) and adopting a diode dedicated region as in Japanese Patent Application Laid-Open Publication No. 2008-192737. However, in this case, a problem arises in that at the bottom portion of trenches disposed near the border of the IGBT portion and the diode portion, electric field concentrates, and the breakdown voltage degrades.

SUMMARY OF THE INVENTION

To solve the problems above and achieve an object, the semiconductor device according to the present invention is a semiconductor device having a first element portion that is an operating region of an insulated gate bipolar transistor and a second element portion that is an operating region of a diode disposed in parallel on a single semiconductor substrate. The first element portion has a semiconductor layer of a first conductivity type, a first semiconductor region of a second conductivity type, a second semiconductor region of the first conductivity type, a first trench, a first gate electrode, and a third semiconductor region of the second conductivity type. The semiconductor layer is formed from the semiconductor substrate of the first conductivity. The first semiconductor region is provided in a first principal surface side of the semiconductor layer. The second semiconductor region is provided selectively in the first semiconductor region. The first trench reaches the semiconductor layer, through the second semiconductor region and the first semiconductor region. The first gate electrode is provided inside the first trench, via a first gate insulating film. The third semiconductor region is provided in a second principal surface side of the semiconductor layer. The second element portion has the first semiconductor region, a second trench, a second gate electrode, and a fourth semiconductor region of the first conductivity type. The second trench reaches the semiconductor layer, via the first semiconductor region. The second gate electrode is provided inside the second trench, via a second gate insulting film. The fourth semiconductor region is provided in the second principal surface side of the semiconductor layer. A first electrode contacts the first semiconductor region and the second semiconductor region. A second electrode contacts the third semiconductor region and the fourth semiconductor region. A width of the second trench is uniform along a depth direction or narrows from a first electrode side toward a second electrode side.

In the semiconductor device above, a depth of the second trench is shallower than a depth of the first trench.

In the semiconductor device above, a portion of the second electrode side is narrower than a portion of the first electrode side in a portion between the first trench and an adjacent first trench.

In the semiconductor device above, a thickness of the first gate insulating film is formed to be thicker at the portion of the second electrode side than at the portion of the first electrode side, and the portion between the first trench and the adjacent first trench is narrower at the portion of the second electrode side than at the portion of the first electrode side.

In the semiconductor device above, a boundary surface of a portion of a second electrode side of the first gate insulating film and the first gate electrode is positioned farther inward in the first trench than a boundary surface of a portion of a first electrode side of the first gate insulating film and the first gate electrode.

In the semiconductor device above, a width of the first trench is narrower at a trench lower portion of the second electrode side than at a trench upper portion of the first electrode side. A border of the trench upper portion and the trench lower portion is positioned more on the first electrode side than a border of the first semiconductor region and the semiconductor layer.

In the semiconductor device above, a width of the trench upper portion is a width of the trench upper portion is narrower than a sum of a width of the trench lower portion and a thickness of the first gate insulating film of both side walls of the trench lower portion.

The other objects, features, and advantages of the present invention are specifically set forth in or will become apparent from the following detailed description of the invention when read in conjunction with the accompanying drawings.

BRIEF DESCRIPTION OF THE DRAWINGS

FIGS. 1A and 1B are schematic views of components of a semiconductor device according to a first embodiment;

FIGS. 2A, 2B, 3A, 3B, 4A, 4B, 5A, 5B, 6A, 6B, 7A, 7B, 8A, 8B, 9A, 9B, 10A, 10B, 11A, 11B, 12A, 12B, 13A, and 13B are cross sectional views depicting states of the semiconductor device according to the first embodiment during fabrication;

FIGS. 14A and 14B are schematic views of components the semiconductor device according to a second embodiment;

FIGS. 19A and 19B are schematic views of a conventional RC-IGBT gate structure.

DETAILED DESCRIPTION OF THE PREFERRED EMBODIMENTS

Figure 1B:
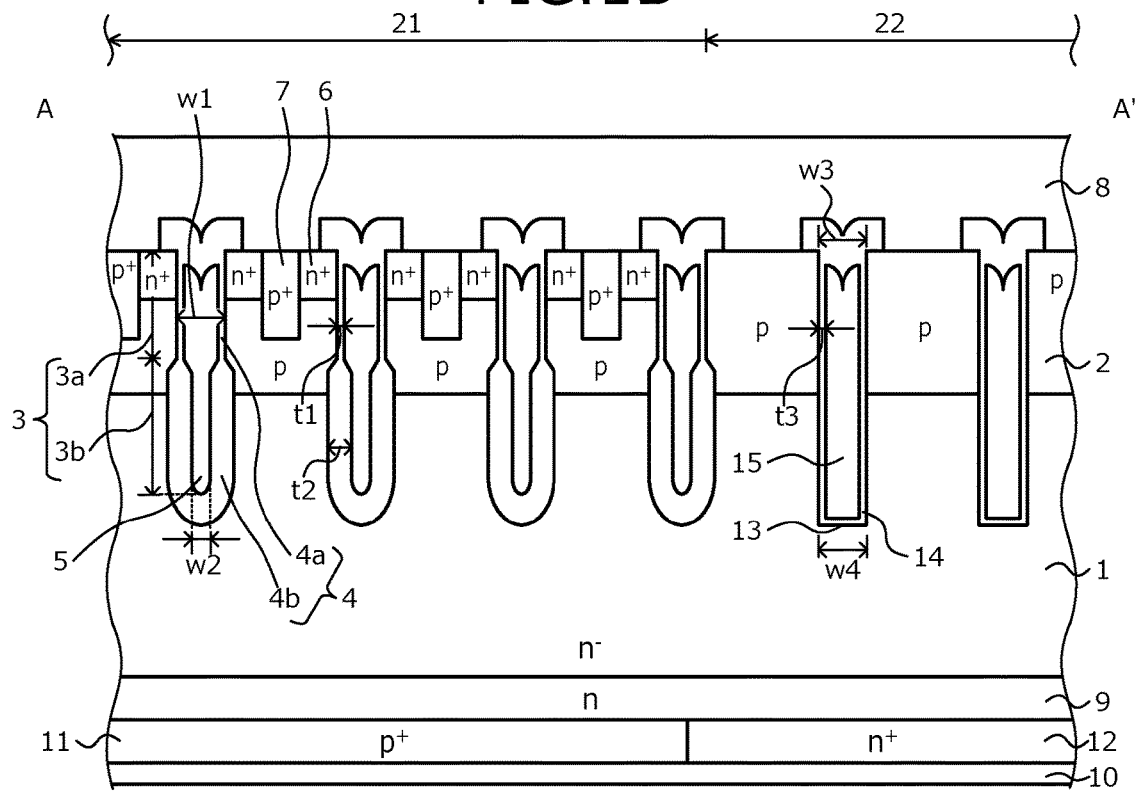

Embodiments of a semiconductor device according to the present invention will be described in detail with reference to the accompanying drawings. In the description and accompanying drawings, layers and/or areas indicated with "n" or "p", indicate that electrons or holes are the majority carriers, respectively. "+" or "−" appended to "n" or "p" indicates a relatively higher or a relatively lower impurity concentration as compared to the impurity concentration of a layer or area without "+" or "−" appended thereto. In the description of the embodiments and in the accompanying drawings hereinafter, identical components are given the same reference numerals and redundant description is omitted.

Embodiment 1

A structure of the semiconductor device according to a first embodiment will be described. FIGS. 1A and 1B are schematic views of components of the semiconductor device according to the first embodiment. FIG. 1A depicts a planar structure of a trench structure portion (MOS gate portion); FIG. 1B depicts a cross sectional structure along cutting plane line A-A' of FIG. 1A. In FIG. 1A, depiction of first and second gate insulating films 4 and 14, an interlayer insulation film, and an emitter electrode 8 is omitted (similarly in FIGS. 14A and 14B). As depicted in FIGS. 1A and 1B, the semiconductor device according to the first embodiment is an RC-IGBT having a trench-gate-type IGBT and a diode connected antiparallel to the IGBT integrated on a single semiconductor substrate (semiconductor chip). More specifically, on a single semiconductor substrate, an IGBT portion (first element portion) 21 forming an IGBT operating region and a diode portion (second element portion) 22 forming a diode operating region are provided in parallel.

In the IGBT portion 21, a p-type base region (first semiconductor region) 2 is provided in a superficial layer of a front surface (first principal surface) of an $n^-$-type semiconductor substrate forming an $n^-$-type drift layer (semiconductor layer) 1. Plural first trenches 3 that pass through the p-type base region 2 and reach the $n^-$-type drift layer 1 are provided at given intervals. The plural first trenches 3 are disposed in a striped-shape planar layout, separating the p-type base region 2 into plural portions (mesa portions). The width of the first trenches 3 (width along the direction in which the first trenches 3 are aligned) is narrower at a portion (hereinafter, first trench lower portion) 3b of a collector side that at a portion (hereinafter, first trench upper portion) 3a of the emitter side (w1>w2). A border of the first trench upper portion 3a and the first trench lower portion 3b, for example, is positioned more on the emitter side than the border of the p-type base region 2 and the $n^-$-type drift layer 1.

Inside the first trench 3, along an inner wall (inner wall of the first trench upper portion 3a and the first trench lower portion 3b) of the first trench 3, the first gate insulating film 4 is provided, and at an inner side of the first gate insulating film 4, a first gate electrode 5 is provided. Thickness of the first gate insulating film 4 is thicker at a portion (hereinafter, first gate insulating film lower portion) 4b provided in an inner wall of the first trench lower portion 3b than at a portion (hereinafter, first gate insulating film upper portion) 4a provided in an inner wall of the first trench upper portion 3a (t1<t2). A width w1 of the first trench upper portion 3a is narrower than a sum w5(=w2+2×t2) of a width w2 of the first trench lower portion 3b and a thickness t2 of the first gate insulating film lower portion 4b of both side walls of the first trench lower portion 3b.

A boundary surface of the first gate insulating film lower portion 4b and the first gate electrode 5 is positioned more on the inside of the first trench 3 than a boundary surface of the first gate insulating film upper portion 4a and the first gate electrode 5. Further, a boundary surface of the first gate insulating film lower portion 4b and the mesa portion ($n^-$-type drift layer 1) is closer to the adjacent first trench 3 side than a boundary surface of the first gate insulating film upper portion 4a and the mesa portion (p-type base region 2). In other words, the trench structure portion of the IGBT portion 21 is structured where a width (mesa width) of the mesa portion between adjacent first trenches 3 is made narrower at a portion of the collector side than at a portion of the emitter side, the mesa portion is reduced, and the IE effect increased. The first gate electrode 5 reaches the inner side of the first gate insulating film lower portion 4b, from the first gate insulating film upper portion 4a.

Inside the p-type base region 2, an $n^+$-type emitter region (second semiconductor region) 6 and a $p^+$-type contact region 7 are selectively provided in each mesa portion. The $n^+$-type emitter region 6 and the $p^+$-type contact region 7, for example, are disposed in a linear-shaped planar layout parallel to the first trenches 3. The $n^+$-type emitter region 6 opposes the first gate electrode 5 across the first gate insulating film upper portion 4a provided in a side wall of the first trench upper portion 3a. The emitter electrode (first electrode) 8 contacts the $n^+$-type emitter region 6 and the $p^+$-type contact region 7 via a contact hole, and is electrically insulated from the first gate electrode 5 by the interlayer insulation film. In a superficial layer of the back surface of the $n^-$-type semiconductor substrate, an n-type field stop (FS) layer 9 is provided and at a position shallower than the n-type FS layer 9, a $p^+$-type collector region (third semiconductor region) 11 is provided. A collector electrode 10 is provided in a front surface of the $p^+$-type collector region 11 (back surface of $n^-$-type semiconductor substrate).

The p-type base region 2, the emitter electrode 8, interlayer insulation film, the n-type FS layer 9, and the collector electrode 10 described above are provided from the IGBT portion 21 to a diode portion 22. Inside the p-type base region 2 in the diode portion 22, the $n^+$-type emitter region 6 is not provided. Therefore, the p-type base region 2 and the emitter electrode 8 respectively function as a p-type anode region of the diode and an anode electrode in the diode portion 22. Further, second trenches 13 that reach the $n^-$-type drift layer 1 through the p-type base region 2 are provided in the front surface side of the $n^-$-type semiconductor substrate, at given intervals. The second trenches 13 are disposed in a striped-shaped planar layout parallel to the first trenches 3 and separating the p-type base region 2 into plural mesa portions.

The depth of the second trenches 13 is substantially the same as the first trenches 3. The pitch of the second trenches 13 (distance between centers of adjacent trenches), for example, may be the same as the pitch of the first trenches 3. The width of the second trenches 13 (width along the direction in which the second trench 13 are aligned) is uniform along a depth direction (w3=w4), or narrows from the emitter side toward the collector side (w3>w4). In other words, the width of a mesa portion between adjacent second trenches 13 is uniform along the depth direction, or widens from the emitter side toward the collector side. Consequently, during diode operation, accumulation of minority carriers (holes) near the p-type anode region (p-type base region 2) can be suppressed. More specifically, a cross sectional shape of the second trench 13, for example, is a substantially rectangular shape having an equal width along the depth direction, or a substantially trapezoidal shape having the side walls as legs and a bottom that is narrower at the collector side (bottom portion side) than the emitter side (open end side).

A width w3 the emitter side of the second trench 13 and a width w4 of the collector side of the second trench 13 are both narrower than the sum w5 of the width w2 of the first trench lower portion 3b and the thickness t2 of the first gate insulating film lower portion 4b of both side walls of the first trench lower portion 3b (w4<w5). The width w3 of emitter side of the second trench 13 may be the same as the width w1 of the first trench upper portion 3a (w3=w1), and narrower than the width w1 of the first trench upper portion 3a (w3<w1). Inside the second trench 13, the second gate insulating film 14 is provided along the inner wall of the second trench 13, and a second gate electrode 15 is provided in the inner side of the second trench 13. The thickness t3 of the second gate insulating film 14, for example, is thicker than a thickness t1 of the first gate insulating film upper portion 4a of the IGBT portion 21. The second gate electrode 15 may have a floating potential and, for example, may be electrically connected to the first gate electrode 5 or the emitter electrode 8 in a non-depicted portion.

Further, in the diode portion 22, back surface side of the $n^-$-type semiconductor substrate is structured to replace a portion of the $p^+$-type collector region 11 with a $n^+$-type cathode region (fourth semiconductor region) 12. In other words, the $n^+$-type cathode region 12 is provided at a position that is shallower than the n-type FS layer 9 from the substrate back surface and is adjacent to the $p^+$-type collector region 11. Therefore, the $p^+$-type collector region 11 opposes the MOS gate structure ($n^+$-type emitter region 6, first gate electrode 5, etc.) of the IGBT, across the $n^-$-type drift layer 1; and the $n^+$-type cathode region 12 opposes the p-type anode region (p-type base region 2) of the diode, across the $n^-$-type drift layer 1. The collector region (second electrode) 10 contacts the $n^+$-type cathode region 12 and functions as a cathode electrode.

Figure 2A:
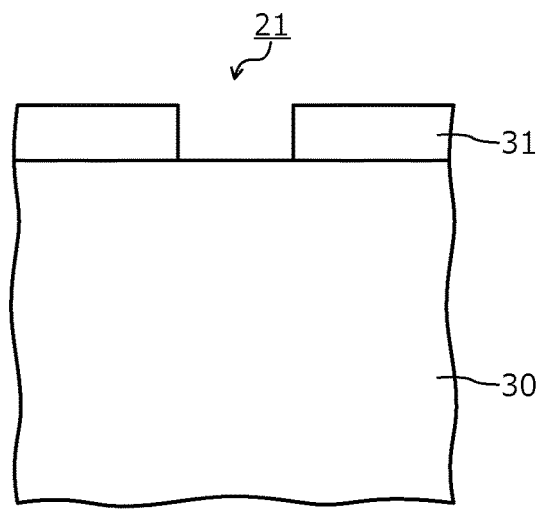
Figure 2B:
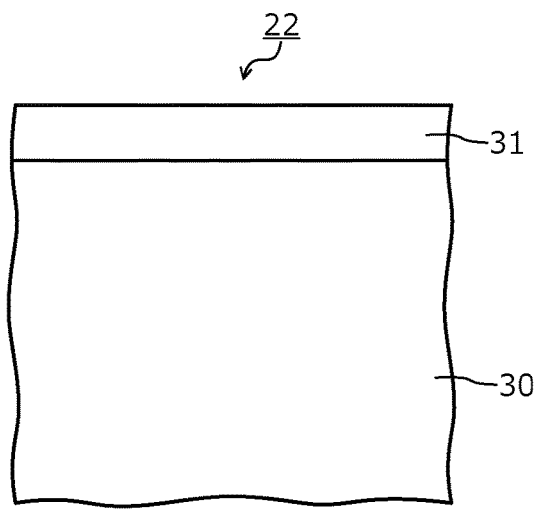

A fabrication method of the semiconductor device according to the first embodiment will be described. FIGS. 2A, 2B, 3A, 3B, 4A, 4B, 5A, 5B, 6A, 6B, 7A, 7B, 8A, 8B, 9A, 9B, 10A, 10B, 11A, 11B, 12A, 12B, 13A, and 13B are cross sectional views depicting states of the semiconductor device according to the first embodiment during fabrication. FIGS. 2A to 13A depict a formation region and vicinity of a single first trench 3 of the IGBT portion; FIGS. 2B to 13B depict a formation region and vicinity of a single second trench 13 of the diode portion 22. As depicted in FIGS. 2A and 2B, for example, an n-type FZ wafer 30 of a 6-inch diameter, forming the $n^-$-type drift layer 1, and fabricated by a floating zone (FZ) technique is used. Alternatively, in place of the n-type FZ wafer, an n-type wafer fabricated by a magnetic CZ (MCZ) technique may be used. Resistivity of the n-type FZ wafer 30, for example, may be on the order of 40 Ωcm or greater to 80 Ωcm or less, such as, for example, about 60 Ωcm. Subsequently, in a front surface (first principal surface) of the n-type FZ wafer 30, an oxide mask 31 is formed having an opened portion corresponding to the formation region of the first trench 3 in the IGBT portion 21.

Figure 3A:
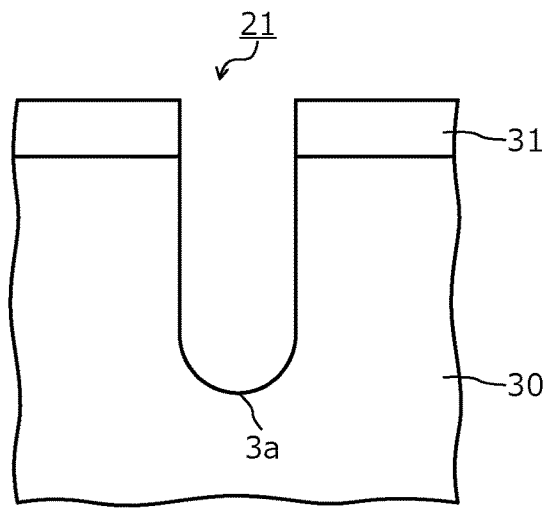
Figure 3B:
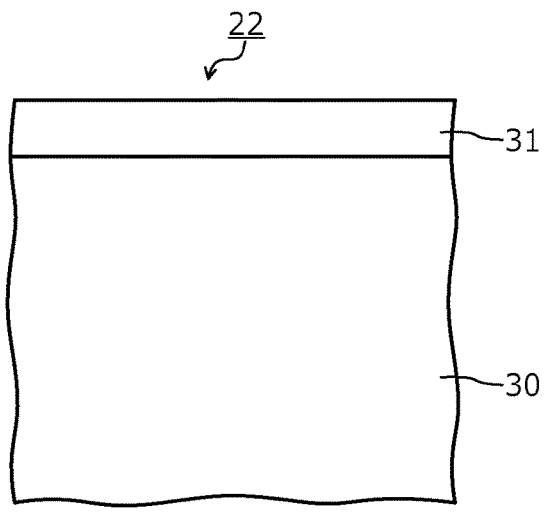
Figure 4A:
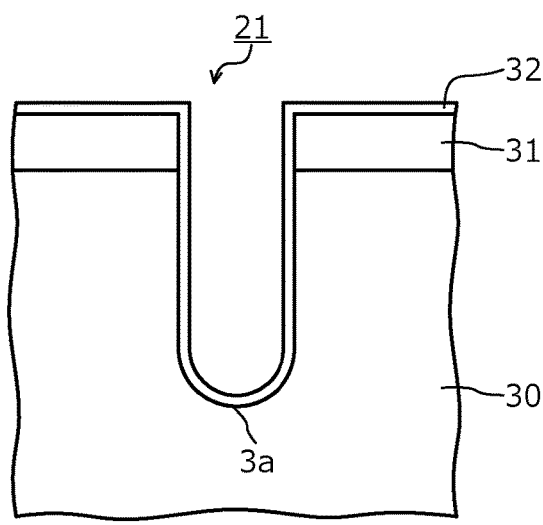
Figure 4B:
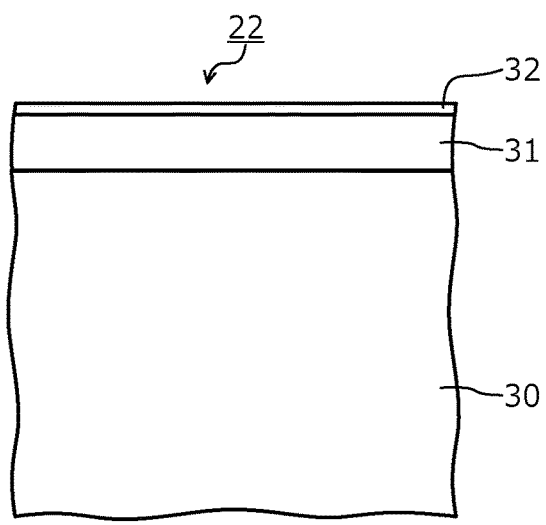
Figure 5A:
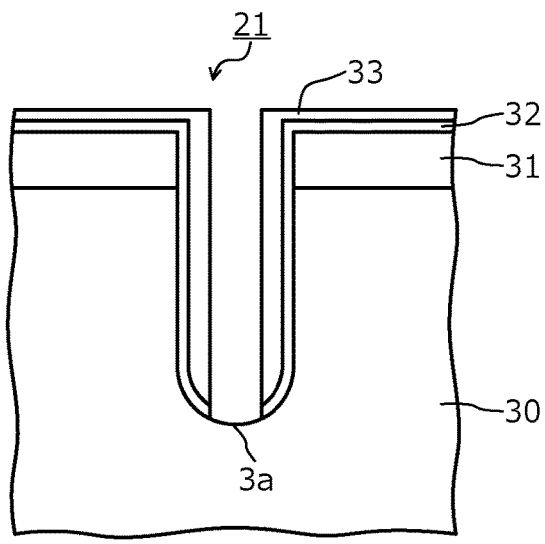
Figure 5B:
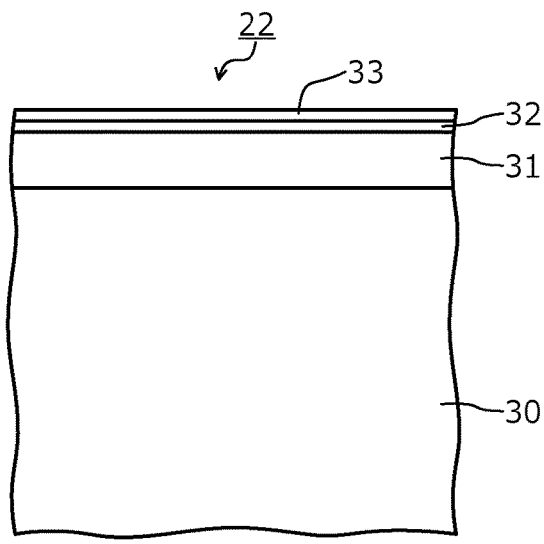

Subsequently, as depicted in FIGS. 3A and 3B, etching is performed using the oxide mask 31 as a mask, and the first trench upper portion 3a is formed in the IGBT portion 21. At this point, since the diode portion 22 is covered by the oxide mask 31, the diode portion 22 is not etched. The depth of the first trench upper portion 3a may be a depth of 5 μm, for example, from the front surface of the n-type FZ wafer 30. Subsequently, as depicted in FIGS. 4A and 4B, a first oxide film 32 of a thickness of 0.1 μm, for example, is formed in the front surface of the oxide mask 31 and the inner wall of the first trench upper portion 3a. The first oxide film 32 forms the first gate insulating film upper portion 4a. Subsequently, as depicted in FIGS. 5A and 5B, by a chemical vapor deposition (CVD) technique, for example, a nitride film 33 of a thickness of 0.3 μm, for example, is grown on the front surface of the first oxide film 32.

Figure 6A:
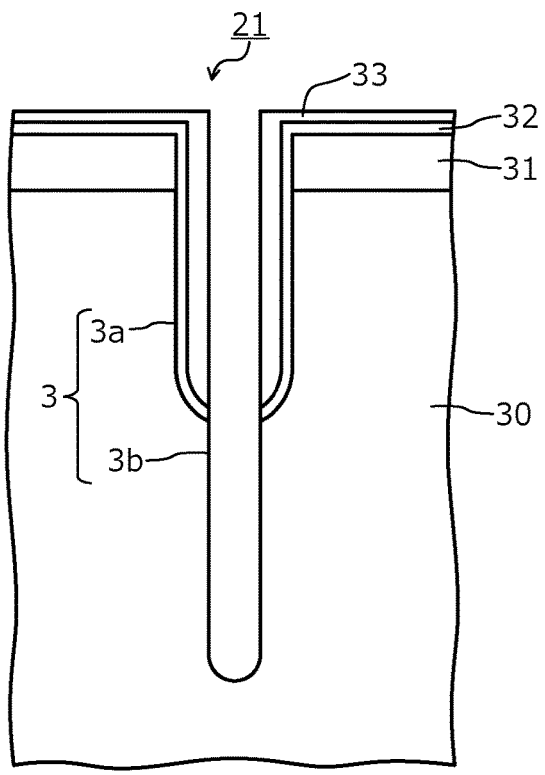
Figure 6B:
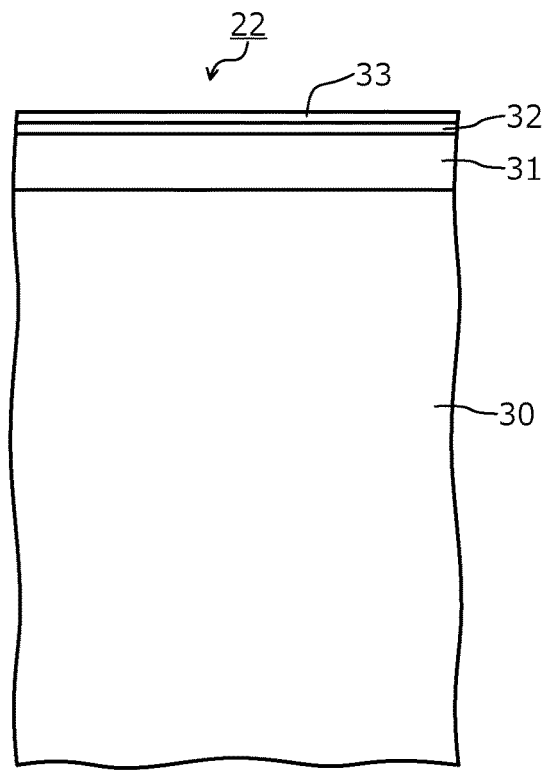

Subsequently, on the nitride film 33, a resist mask (not depicted) opened at a portion corresponding to a bottom portion of the first trench upper portion 3a is formed. Subsequently, dry etching, for example, is performed using this resist mask as a mask, the nitride film 33 and the first oxide film 32 of the bottom portion of the first trench upper portion 3a are removed, and the bottom portion of the first trench upper portion 3a is exposed. Subsequently, after the resist mask is removed, as depicted in FIGS. 6A and 6B, etching is performed using the remaining portion of the nitride film 33 as a mask, the semiconductor portion exposed at the bottom portion of the first trench upper portion 3a is removed, and the first trench lower portion 3b is formed. The depth of the first trench lower portion 3b may be, for example, 3 μm, 5 μm, or 10 μm. Thus, the first trench 3 is formed from the first trench upper portion 3a and the first trench lower portion 3b.

Figure 7A:
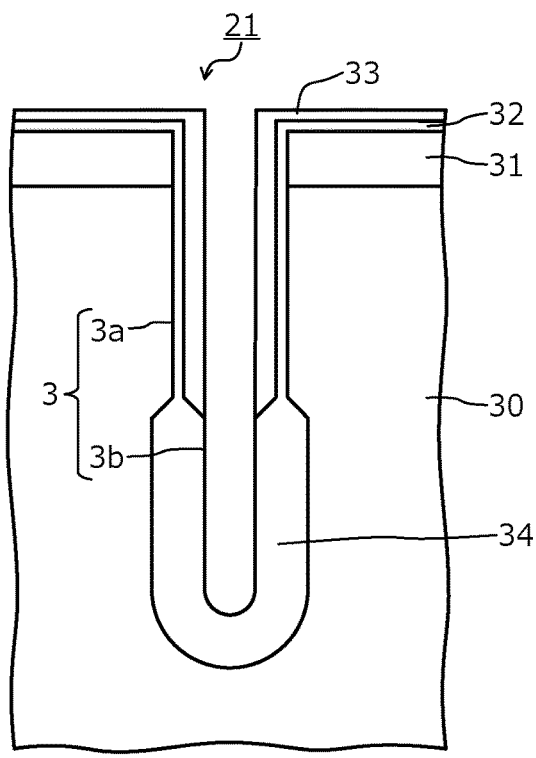
Figure 7B:
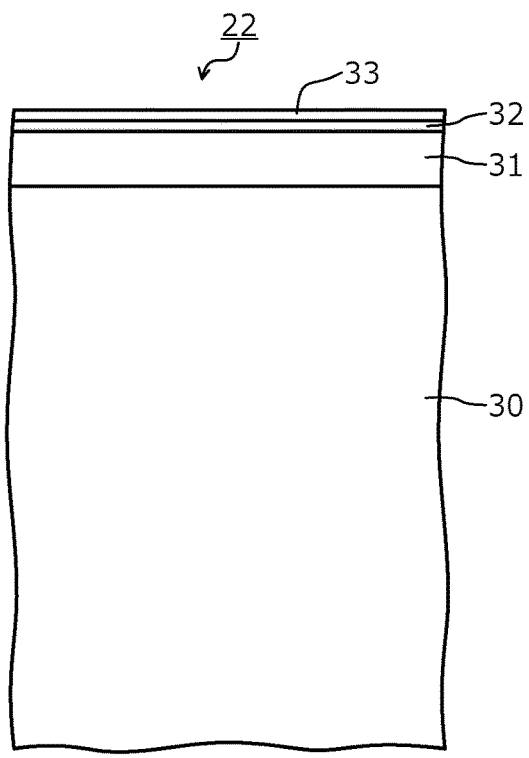
Figure 8A:
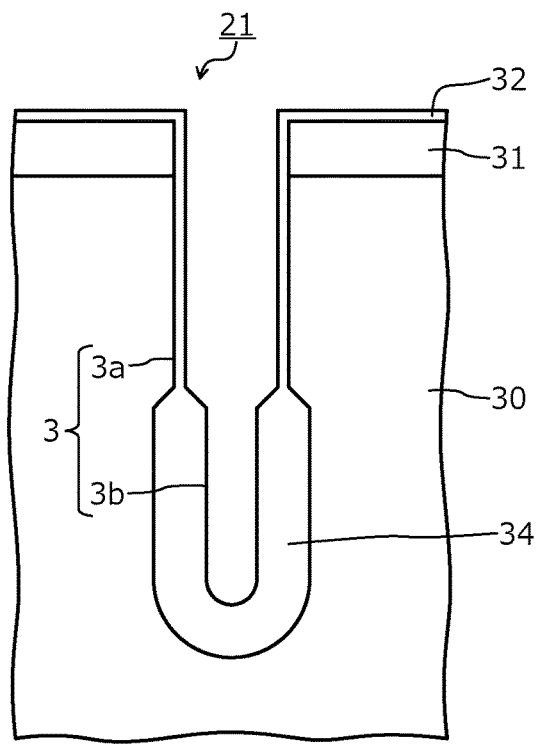
Figure 8B:
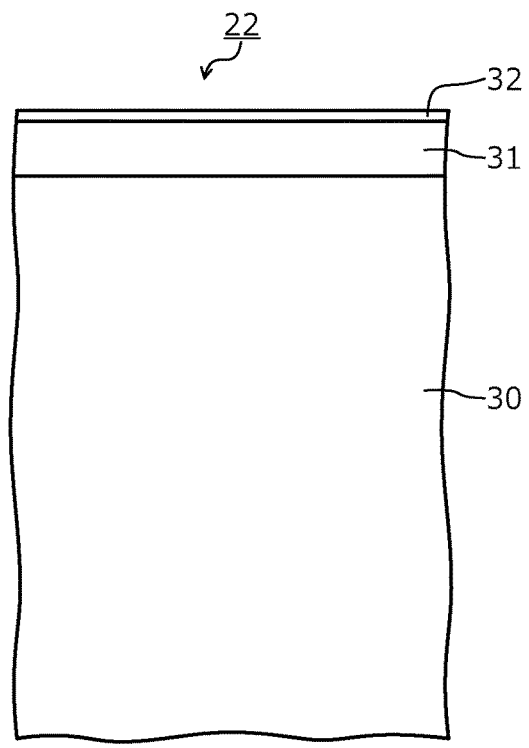
Figure 9A:
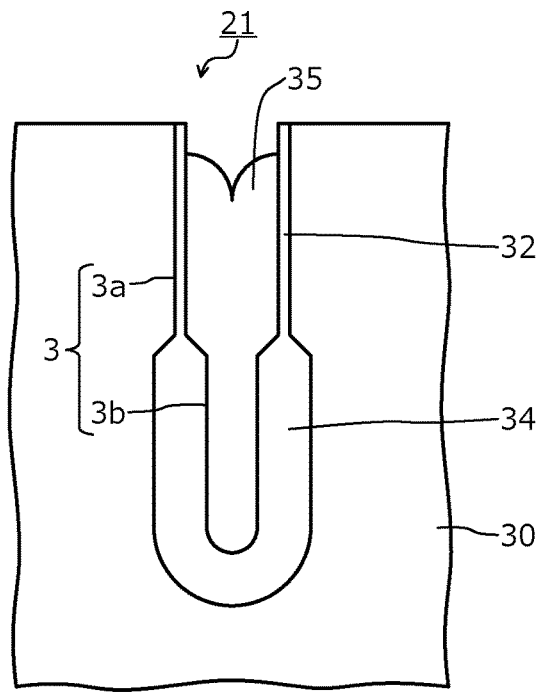
Figure 9B:
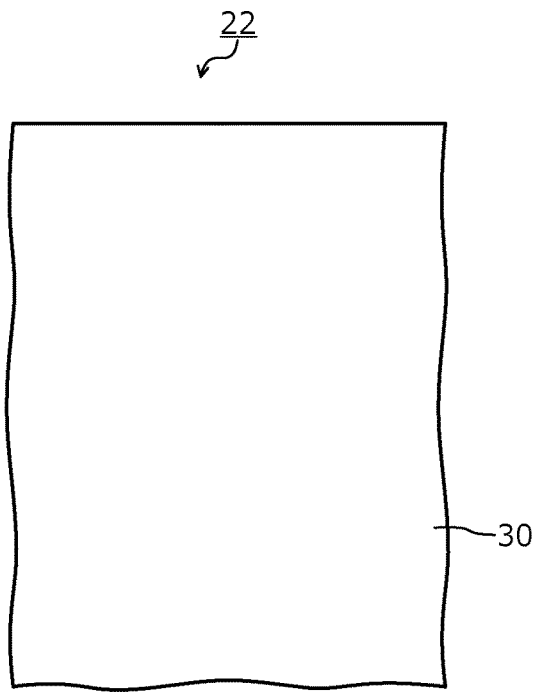

Subsequently, as depicted in FIGS. 7A and 7B, a second oxide film 34 is formed in the inner wall of the first trench lower portion 3b. The second oxide film 34 forms the first gate insulating film lower portion 4b. The thickness of the second oxide film 34 is thicker than the first oxide film 32 and, for example, is preferably 0.2 μm or greater and 2.0 μm or less. At this point, since the first oxide film 32 is covered by the nitride film 33, the first oxide film 32 is not grown. In other words, when the second oxide film 34 is formed, the first oxide film 32 does not become thick. Subsequently, as depicted in FIGS. 8A and 8B, all of the remaining the nitride film 33 is removed. Further, as depicted in FIGS. 9A and 9B, a portion of the first oxide film 32 on the oxide mask 31 and the oxide mask 31 are removed, leaving the first and the second oxide films 32 and 34 respectively in the first trench upper portion 3a and the first trench lower portion 3b.

Figure 10A:
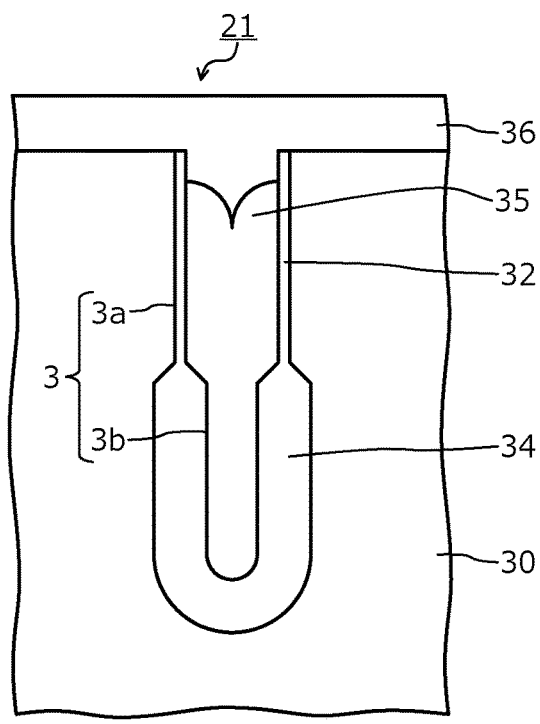
Figure 10B:
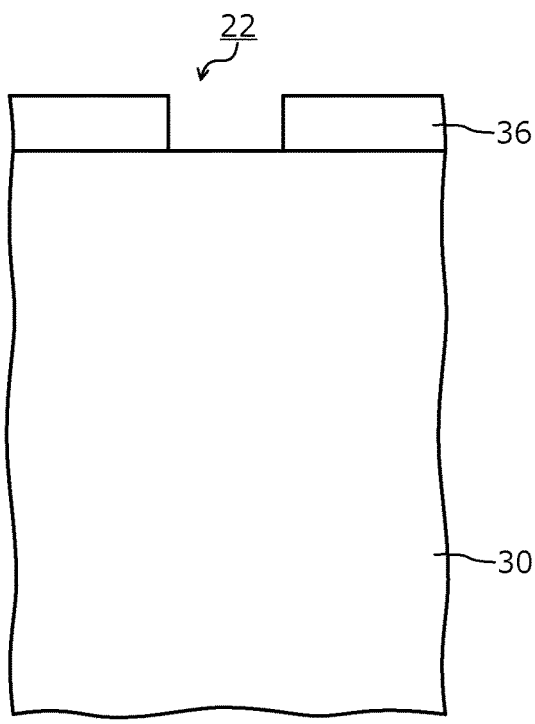
Figure 11A:
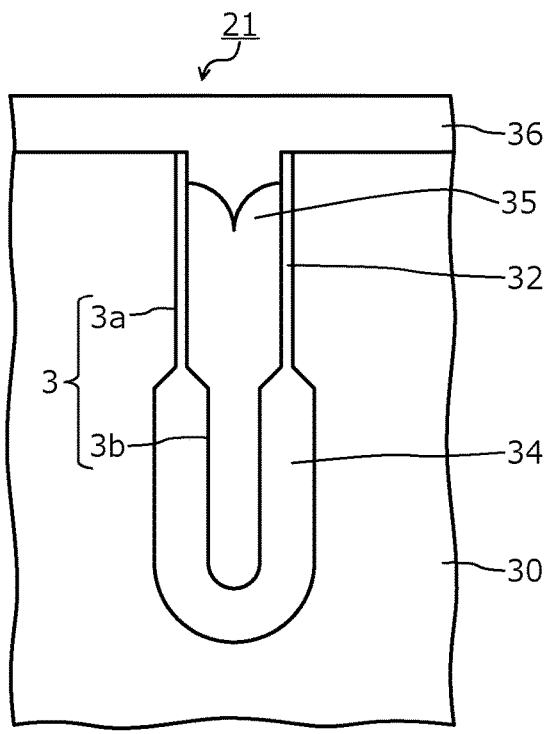
Figure 11B:
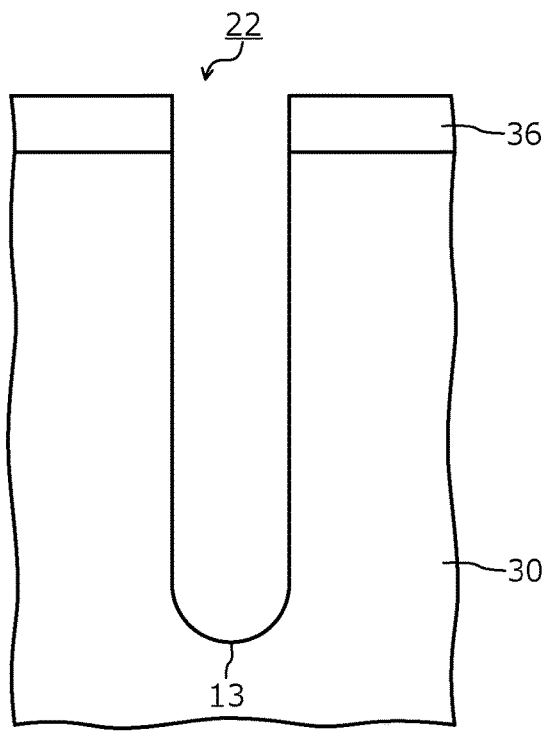

Subsequently, a low resistivity poly-silicon (poly-Si) layer 35 doped in the n-type so as to be embedded inside the first trench 3 (first trench upper portion 3a and first trench lower portion 3b) is deposited and etched, whereby the low resistivity poly-silicon layer 35 remains inside the first trench 3. The low resistivity poly-silicon layer 35 forms the first gate electrode 5. Subsequently, as depicted in FIGS. 10A and 10B, in the front surface of the n-type FZ wafer 30, an oxide mask 36 is formed having an opened portion corresponding to the formation region of the second trench 13 in the diode portion 22. Subsequently, as depicted in FIGS. 11A and 11B, etching is performed using the oxide mask 36 as a mask, and the second trench 13 of a depth substantially the same as the first trench 3 is formed in the diode portion 22. At this point, since the IGBT portion 21 is covered by the oxide mask 36, the IGBT portion 21 is not etched.

Figure 12A:
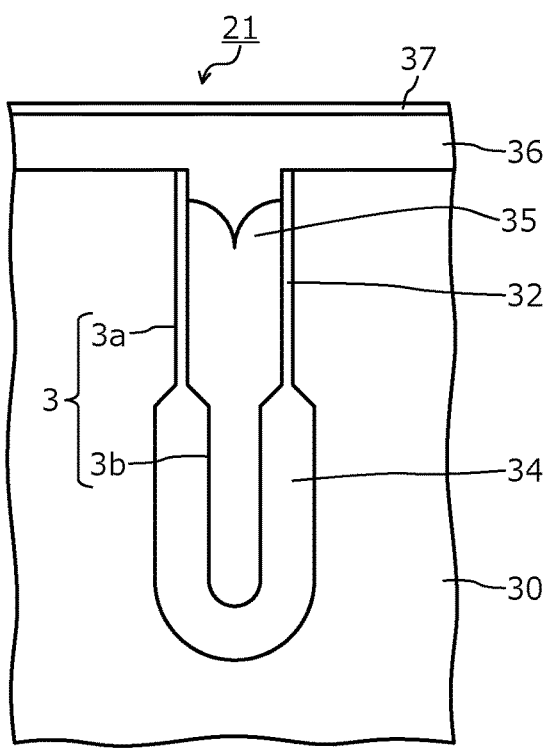
Figure 12B:
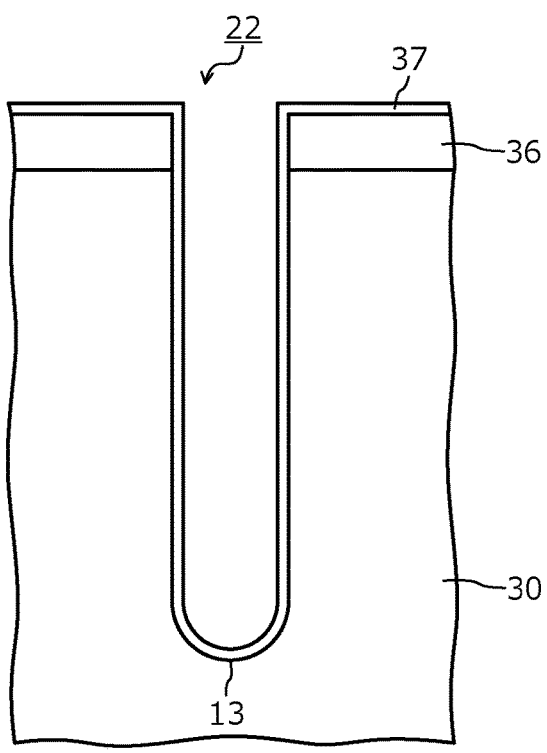

Subsequently, as depicted in FIGS. 12A and 12B, in the inner wall of the second trench 13 and the front surface of the oxide mask 36, a third oxide film 37 is formed. The third oxide film 37 forms the second gate insulating film 14. The thickness of the third oxide film 37 is thicker than the first oxide film 32 and preferably, for example, on the order of 0.2 μm or greater and 2.0 μm or less. Subsequently, as depicted in FIGS. 13A and 13B, a portion of the third oxide film 37 on the oxide mask 36 and the oxide mask 36 are removed, leaving the third oxide film 37 inside the second trench 13. Subsequently, a low resistivity poly-silicon layer 38 doped in the n-type so as to be embedded inside the second trench 13 is deposited and etched, whereby the low resistivity poly-silicon layer 38 remains inside the second trench 13. The low resistivity poly-silicon layer 38 is the second gate electrode 15.

Thus, after trench structure portions of the diode portion 22 and the IGBT portion 21 are formed, by a general method, the p-type base region 2, the n$^+$-type emitter region 6, and the p$^+$-type contact region 7 are formed on the front surface side of the n-type FZ wafer 30. Subsequently, by covering the front surface side of the n-type FZ wafer 30 by a resist film, the device structure on the front surface side of the n-type FZ wafer 30 is protected. Subsequently, the n-type FZ wafer 30 is ground or wet-etched from the back surface side, making the n-type FZ wafer 30 a given thickness. For example, in the case of a 1200V breakdown rating, the thickness of the n-type FZ wafer 30 at this stage is typically on the order of 100 μm or greater to 160 μm or less, and may be 140 μm, for example.

Subsequently, from the back surface side of the n-type FZ wafer 30 after grinding, ion injection for forming the n-type FS layer 9 and the p$^+$-type collector region 11 is performed sequentially. The ion injection for forming the n-type FS layer 9, for example, uses selenium (Se) as a dopant and, the accelerating voltage and the dosing amount may be about 100 keV and about $3 \times 10^{14}/cm^2$, respectively. The ion injection for forming the p$^+$-type collector region 11, for example, uses boron (B) as a dopant and, the accelerating voltage and the dosing amount may be about 40 keV and about $8 \times 10^{13}/cm^2$, respectively.

Subsequently, a resist mask (not depicted) of a 2-μm thickness, for example, is formed in the back surface of the n-type FZ wafer 30 by photolithography, and has an opened portion corresponding to the formation region of the n$^+$-type cathode region 12. Subsequently, by performing ion injection using this resist mask as a mask and compensating a portion of the p$^+$-type collector region 11 with an n-type impurity, the n$^+$-type cathode region 12 is formed. The ion injection for forming the n$^+$-type cathode region 12, for example, uses phosphorus (P) as a dopant and, the accelerating voltage and the dosing amount may be about 110 keV and about $2 \times 10^{15}/cm^2$, respectively.

Subsequently, after the resist film on the front surface and the resist mask on the back surface of the n-type FZ wafer 30 are stripped, for example, heat treatment is performed at a temperature of about 950 degrees C., for about 30 minutes whereby, ion injection regions formed by the ion injections are activated. Subsequently, in the front surface side of the n-type FZ wafer 30, for example, a metal layer of a thickness of about 5 μm, for example, is formed from aluminum-silicon (Al—Si) and the emitter electrode 8 is formed using this metal layer as patterning. Subsequently, helium (He) is irradiated from the back surface side of the n-type FZ wafer 30 whereby, a defect is formed inside the n-type FZ wafer 30. The accelerating voltage and the dosing amount at this time may be, for example, about 23 MeV and about $1 \times 10^{13}/cm^2$, respectively.

Subsequently, for example, by annealing (heat treatment) at a temperature of about 370 degrees C., for about 1 hour, the defect inside the n-type FZ wafer 30 corrected. Subsequently, in the back surface of the n-type FZ wafer 30, for example, films of aluminum (Al), titanium (Ti), nickel (Ni), and gold (Au) respectively of thicknesses of 1 μm, 0.07 μm, 1 μm, and 0.3 μm are sequentially formed, whereby the collector electrode 10 that is common to the p$^+$-type collector region 11 and the n$^+$-type cathode region 12 is formed. Thereafter, the n-type FZ wafer 30 is diced into a chip-shape, whereby semiconductor device depicted in FIGS. 1A and 1B is completed.

As described, according to the first embodiment, the cross sectional shape of the second trenches of the diode portion is substantially a rectangular shape or a trapezoidal shape, whereby even when in IGBT portion, the mesa portions are reduced (reduction of mesa width) and the IE effect is enhanced, during diode operation, the accumulation of minority carriers (holes) near the p-type anode region (p-type base region) can be reduced. Therefore, the reverse recovery current during diode operation can be prevented from becoming large. Further, the reverse recovery voltage during diode operation can be prevented from becoming large, enabling soft recovery. In other words, reverse recover properties during diode operation can be improved. Further, according to the first embodiment, since the trench structure portion is disposed not only in the IGBT portion but also in the diode portion, the concentration of electric field at the bottom portion of the first trenches disposed near the border of IGBT portion and the diode portion can be prevented. Therefore, degradation in the breakdown voltage can be prevented.

Embodiment 2

Figure 14B:
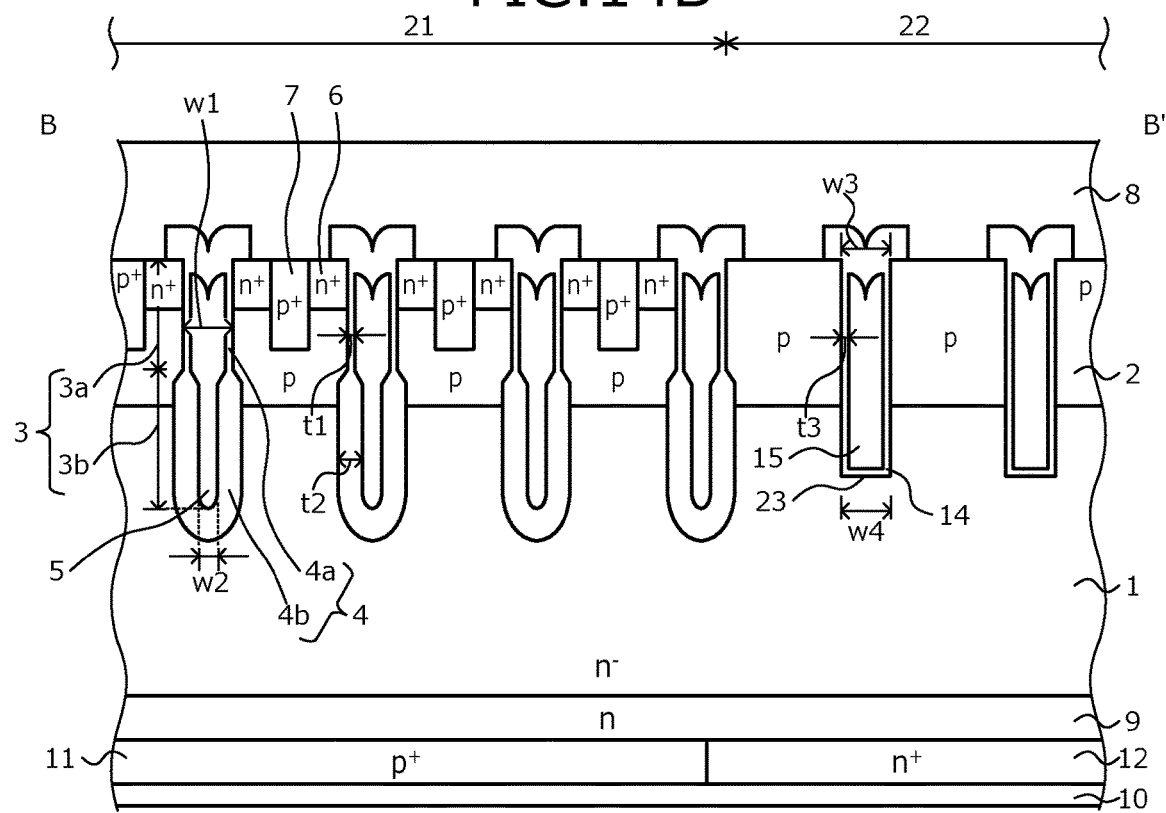

A structure of the semiconductor device according a second embodiment will be described. FIGS. 14A and 14B are schematic views of components the semiconductor device according to the second embodiment. FIG. 14A depicts a planar structure of the trench structure portion; FIG. 14B depicts a cross sectional structure along cutting plane line B-B' of FIG. 14A. A point on which the semiconductor device according to the second embodiment differs from the semiconductor device according to the first embodiment is that the depth of second trenches 23 of the diode portion 22 is shallower than the depth of the first trenches 3 of the IGBT portion 21. The bottom portion of the second trenches 23, for example, is positioned more on the collector side than the border of the p-type base region 2 and the n⁻-type drift layer 1. Inside the second trench 23, similar to the first embodiment, the second gate insulating film 14 is provided along the inner wall of the second trench 23 and the second gate electrode 15 is provided in the inner side of the second gate insulating film 14.

Thus, the depth of the second trenches 23 of the diode portion 22 is shallower than the depth of the first trenches 3 of the IGBT portion 21, whereby the minority carrier accumulation effect in the diode portion 22 can be suppressed. Therefore, the minority carrier (hole) concentration of the emitter side of the diode portion 22 can be reduced, enabling the reverse recovery properties during diode operation to be improved. The fabrication method of the semiconductor device according to the second embodiment suffices to form the second trenches 23 of the diode portion 22 to be shallower than the depth of the first trench lower portion 3b of the IGBT portion 21, when the second trenches 23 of the diode portion 22 are formed in the fabrication method of the semiconductor device according to the first embodiment. The planar layout of the second trenches 23 is the same as that for the first embodiment.

As described, according to the second embodiment, the same effects can be obtained as by the first embodiment.

PRACTICAL EXAMPLE

Figure 15:
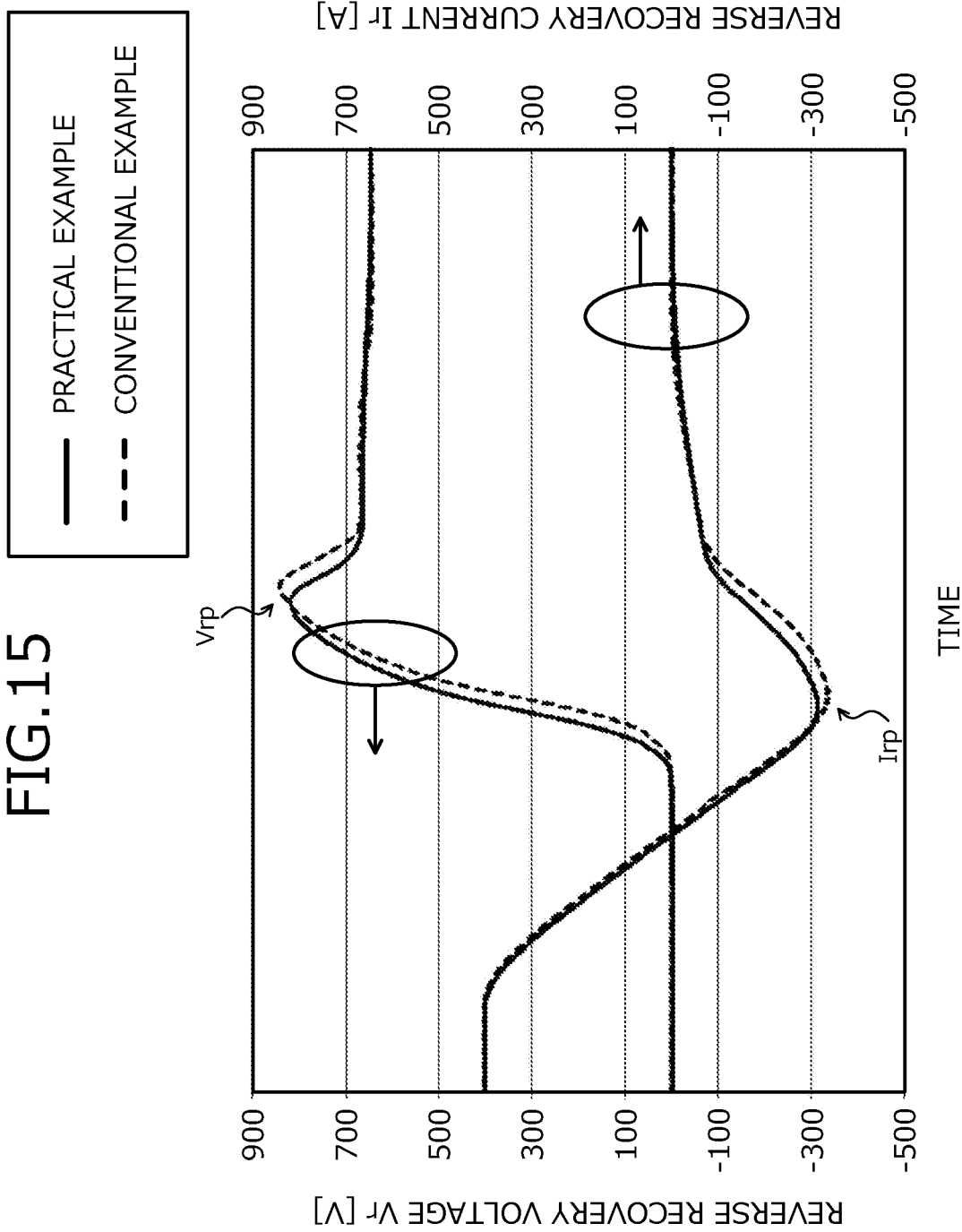
FIG. 15 is a property diagram depicting recovery waveforms of the semiconductor device according to a practical example.
Figure 19B:
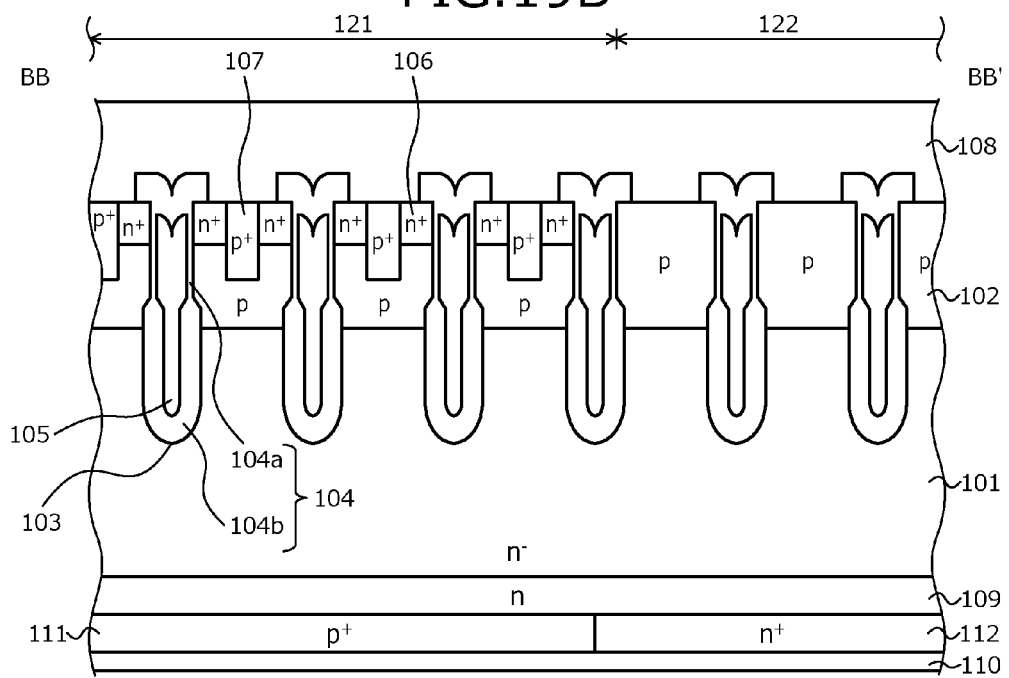

Reverse recovery waveforms of the diode of the semiconductor device according to a practical example will be described. FIG. 15 is a property diagram depicting recovery waveforms of the semiconductor device according to the practical example. First, following the fabrication method of the semiconductor device according to the first embodiment described above, by the various conditions described, an RC-IGBT (hereinafter, practical example) is created in which a trench-gate-type IGBT and a diode connected antiparallel to the IGBT are integrated on a single semiconductor substrate. Reverse recovery waveforms (reverse recovery voltage Vr, reverse recovery current Ir) of the practical example are depicted in FIG. 15. FIG. 15 further depicts reverse recovery waveforms of a conventional RC-IGBT (refer to FIGS. 19A and 19B) in which trench structure portions of the same structure are disposed in the IGBT portion 121 and the diode portion 122. In other words, the configuration of the trench structure portion of the diode portion 122 of a conventional example differs from the practical example.

In both the practical example and the conventional example, the diode is reverse recovered by the same current changing rate di/dt. As a result, as depicted in FIG. 15, it is confirmed that in the practical example, the peak value Irp of the reverse recovery current Ir can be reduced more than the conventional example. Further, in this case, it is confirmed that in the practical example, the peak value Vrp of reverse recovery voltage Vr can be reduced more than the conventional example. In other words, the practical example can achieve a softer recovery than the conventional example, and the occurrence of surge voltage can be suppressed. Factors enabling the practical example to improve reverse recover properties during diode operation (during diode energization) to a greater extent as compared to the conventional example are presumed to be as follows.

Figure 16:
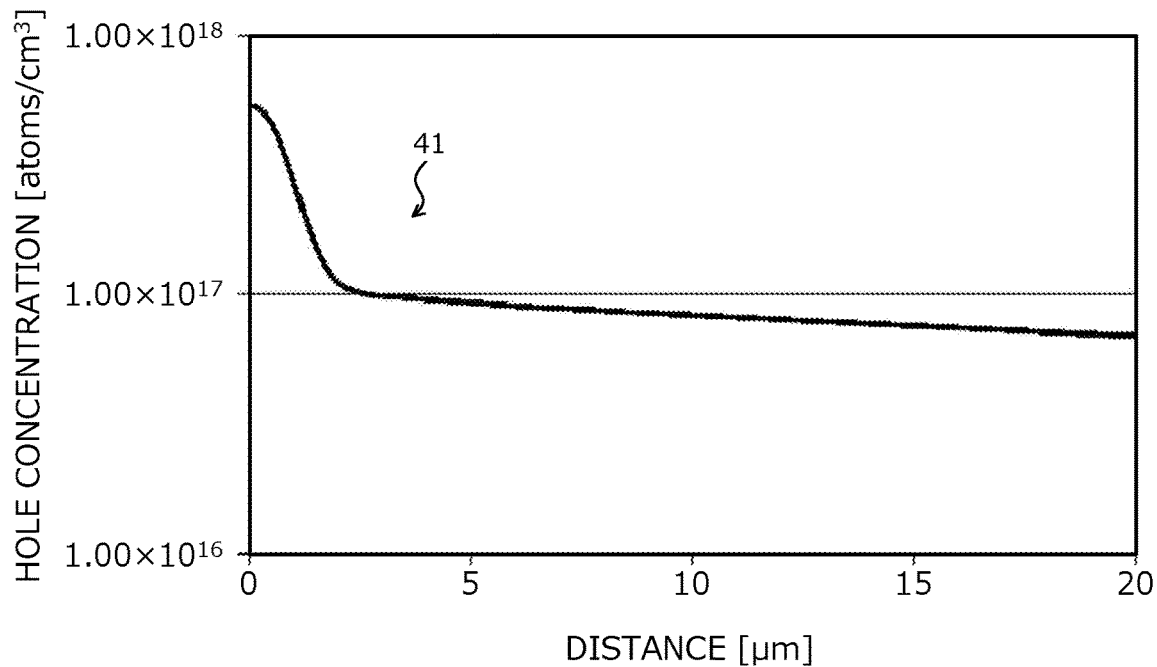
FIG. 16 is a property diagram of hole concentration during operation of a diode of the semiconductor device according to the practical example.
Figure 17:
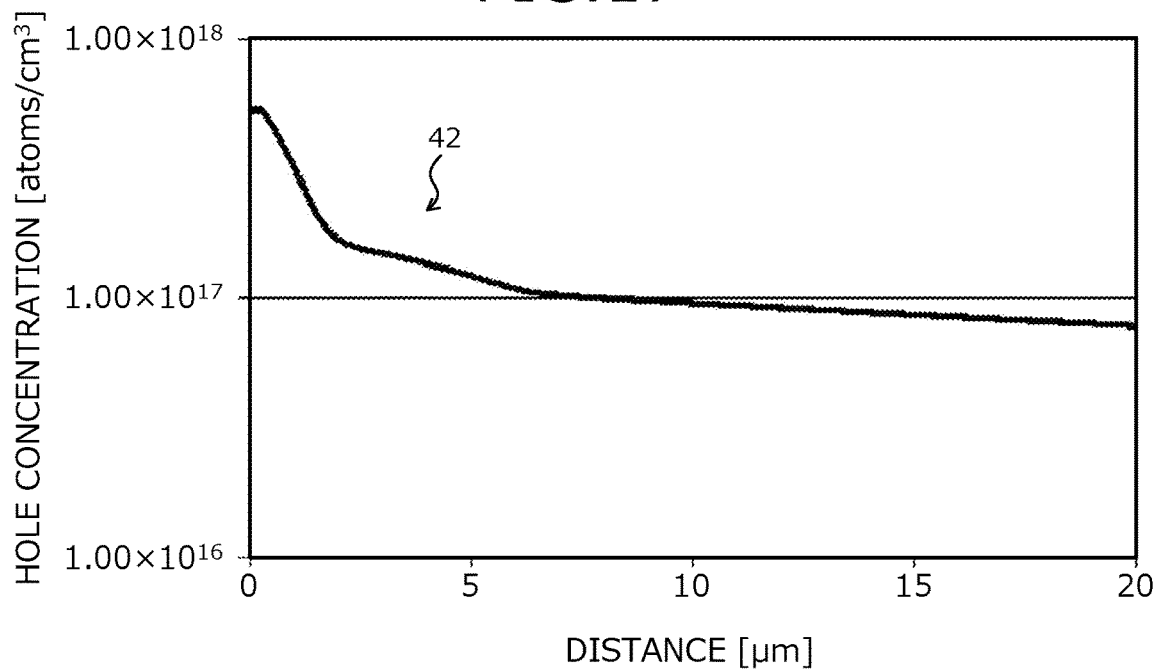
FIG. 17 is a property diagram of hole concentration during operation of a diode of a semiconductor device according to a conventional example.
Figure 18A:
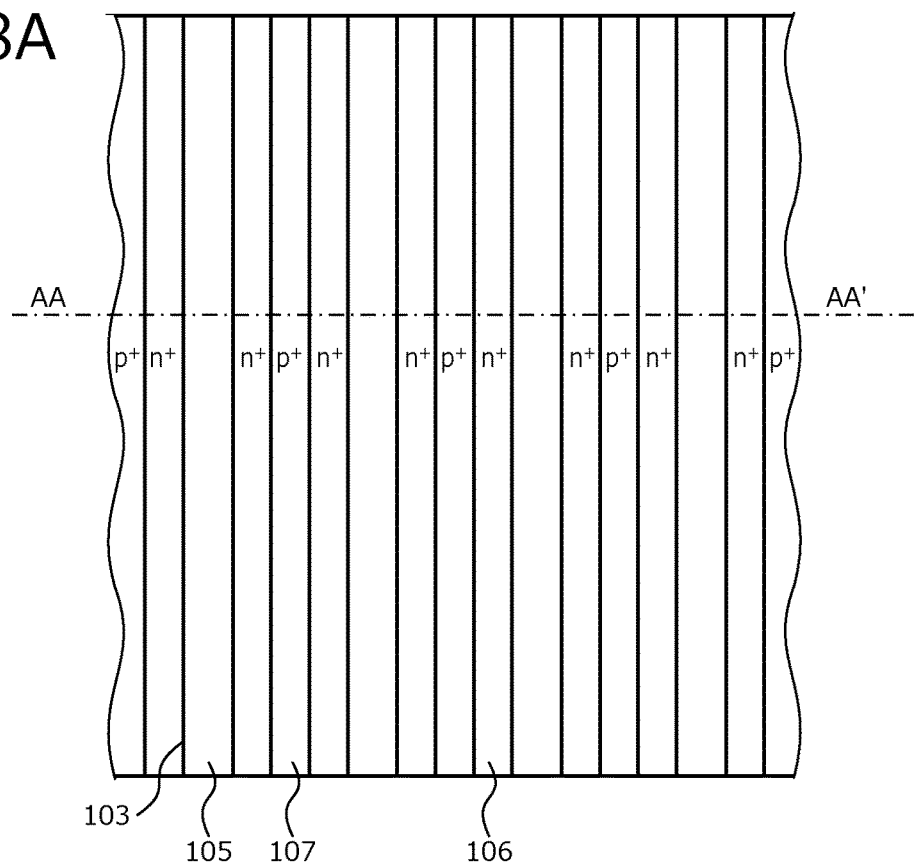
FIGS. 18A and 18B are schematic views of a conventional IGBT gate structure.
Figure 18B:
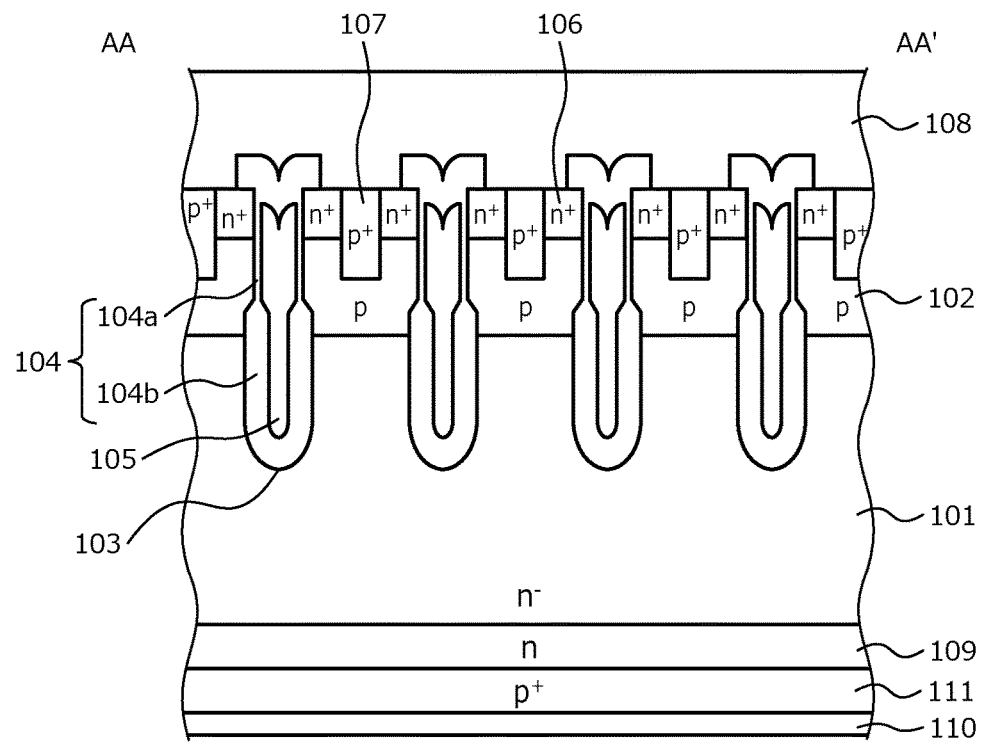

FIG. 16 is a property diagram of hole concentration during operation of the diode of the semiconductor device according to the practical example. FIG. 17 is a property diagram of hole concentration during operation of the diode of the semiconductor device according to the conventional example. The horizontal axes of FIGS. 16 and 17 assumed the border of the p-type anode region (p-type base region) and the emitter electrode to be 0 μm. In the practical example (refer to FIG. 16), compared to the conventional example (refer to FIG. 17), during diode operation, fewer minority carriers (holes) accumulate near the p-type anode region (portion indicated by reference numeral 41 of the practical example, portion indicated by reference numeral 42 of the conventional example). In this manner, it is presumed that in the practical example, during diode operation, the carrier concentration near the anode can be reduced more than in the conventional example, enabling soft recovery.

In the description above, the present invention can be modified variously within a range not departing from the spirit of the present invention and in each of the embodiments above, for example, component dimensions, impurity concentrations (dosing amounts), etc. can be set variously according to required specifications. Further, even when the anode region of the diode portion of the present invention is of a PiNdiode structure, an MPS structure combining a pn junction and a schottky junction, etc., the same effects are achieved. Further, in each of the embodiments, although a first conductivity type is assumed to be the n-type and a second conductivity type is assumed to be the p-type, the present invention is similarly achieved when the first conductivity type is the p-type and the second conductivity type is the n-type.

As described, according to the present invention, even if in the IGBT portion (first element portion), mesa portion is reduced and the IE effect is enhanced, accumulation of minority carriers (holes) near the anode region (first semiconductor region) in the diode portion (second element portion) during diode operation can be reduced. Therefore, the reverse recovery current during diode operation can be prevented from becoming large. Further, the reverse recovery voltage during diode operation can be prevented from becoming large, enabling soft recovery.

According to the semiconductor device according to the present invention, an effect can be achieved in that in an RC-IGBT in which the IGBT and diode are integrated on a single semiconductor substrate, reverse recover properties during diode operation can be improved.

As described, the semiconductor device according to the present invention is useful in an RC-IGBT having a built-in IGBT and diode integrated on a single substrate and is particularly suitable for a semiconductor device that facilitates high breakdown voltage and in which the thickness of the drift layer (wafer) is thin.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

This application is based upon and claims the benefit of priority of the prior Japanese Patent Application No. 2015-005625, filed on Jan. 15, 2015, the entire contents of which are incorporated herein by reference.

What is claimed is:

1. A semiconductor device having a first element portion that is an operating region of an insulated gate bipolar transistor and a second element portion that is an operating region of a diode disposed in parallel on a single semiconductor substrate, wherein the first element portion comprises:
   a semiconductor layer of a first conductivity type formed by the semiconductor substrate of the first conductivity type,
   a first semiconductor region of a second conductivity type and provided in a first principal surface side of the semiconductor layer,
   a second semiconductor region of the first conductivity type and provided selectively inside the first semiconductor region,
   a first trench configured to reach the semiconductor layer, through the second semiconductor region and the first semiconductor region,
   a first gate electrode provided inside the first trench, via a first gate insulating film, and
   a third semiconductor region of the second conductivity type and provided in a second principal surface side of the semiconductor layer, the second element portion comprises:
   the first semiconductor region,
   a second trench configured to reach the semiconductor layer, through the first semiconductor region,
   a second gate electrode provided inside the second trench, via a second gate insulating film, and
   a fourth semiconductor region of the first conductivity type and provided in the second principal surface side of the semiconductor layer, the semiconductor device further comprising:
   a first electrode configured to contact the first semiconductor region and the second semiconductor region; and
   a second electrode configured to contact the third semiconductor region and the fourth semiconductor region, wherein
   a width of the second trench is any one among uniform along a depth direction, and narrowing from a first electrode side toward a second electrode side.

2. The semiconductor device according to claim 1, wherein
   a depth of the second trench is shallower than a depth of the first trench.

3. The semiconductor device according to claim 1, wherein
   a portion of the second electrode side is narrower than a portion of the first electrode side in a portion between the first trench and an adjacent first trench.

4. The semiconductor device according to claim 3, wherein
   a thickness of the first gate insulating film is formed to be thicker at the portion of the second electrode side than at the portion of the first electrode side, and
   the portion between the first trench and the adjacent first trench is narrower at the portion of the second electrode side than at the portion of the first electrode side.

5. The semiconductor device according to claim 4, wherein
   a boundary surface of a portion of a second electrode side of the first gate insulating film and the first gate electrode is positioned farther inward in the first trench than a boundary surface of a portion of a first electrode side of the first gate insulating film and the first gate electrode.

6. The semiconductor device according to claim 1, wherein
   a width of the first trench is narrower at a trench lower portion of the second electrode side than at a trench upper portion of the first electrode side, and
   a border of the trench upper portion and the trench lower portion is positioned more on the first electrode side than a border of the first semiconductor region and the semiconductor layer.

7. The semiconductor device according to claim 6, wherein
   a width of the trench upper portion is narrower than a sum of a width of the trench lower portion and a thickness of the first gate insulating film of both side walls of the trench lower portion.

* * * * *